(12) United States Patent
Chen et al.

(10) Patent No.: US 10,393,773 B2
(45) Date of Patent: Aug. 27, 2019

(54) SPRING PROBE AND PROBE CARD HAVING SPRING PROBE

(71) Applicant: MPI CORPORATION, Chu-Pei, Hsinchu Shien (TW)

(72) Inventors: Tsung-Yi Chen, Chu-Pei (TW); Ting-Hsin Kuo, Chu-Pei (TW); Yi-Lung Lee, Chu-Pei (TW); Shih-Shin Chen, Chu-Pei (TW); Horng-Chuan Sun, Chu-Pei (TW); Horng-Kuang Fan, Chu-Pei (TW)

(73) Assignee: MPI Corporation, Chu-Pei, Hsinchu Shien (TW)

( * ) Notice: Subject to any disclaimer, the term of this patent is extended or adjusted under 35 U.S.C. 154(b) by 183 days.

(21) Appl. No.: 15/274,409

(22) Filed: Sep. 23, 2016

(65) Prior Publication Data

US 2017/0082656 A1 Mar. 23, 2017

(30) Foreign Application Priority Data

Sep. 23, 2015 (TW) ............................. 104131496 A
Aug. 16, 2016 (TW) ............................. 105126034 A

(51) Int. Cl.
| | | |
|---|---|---|
| *G01R 1/067* | (2006.01) | |
| *G01R 31/28* | (2006.01) | |
| *H01R 12/71* | (2011.01) | |
| *H01R 13/24* | (2006.01) | |
| *H01R 13/436* | (2006.01) | |
| *G01R 31/44* | (2006.01) | |

(52) U.S. Cl.
CPC ..... *G01R 1/06722* (2013.01); *G01R 31/2808* (2013.01); *G01R 31/44* (2013.01); *H01R 13/2421* (2013.01); *H01R 13/4364* (2013.01)

(58) Field of Classification Search
None
See application file for complete search history.

(56) References Cited

U.S. PATENT DOCUMENTS 4,286,661 A * 9/1981 Gazda ..................... E21B 23/02
166/316
4,321,532 A * 3/1982 Luna .................. G01R 1/06722
324/72.5

(Continued)

FOREIGN PATENT DOCUMENTS

| CN | 203535082 U | 4/2014 | |
|---|---|---|---|
| JP | 2015141199 A * | 8/2015 | ......... G01R 1/06722 |

*Primary Examiner* — Jermele M Hollington
(74) *Attorney, Agent, or Firm* — Muncy, Geissler, Olds & Lowe, P.C.

(57) ABSTRACT

A probe card includes a probe seat having upper and lower dies and a probe accommodating hole, a spring probe inserted through the probe accommodating hole and including a spring sleeve having upper and lower non-spring sections, and a circuit board disposed on the upper die and having a contact pad against which the spring probe is abutted. At least one of the upper and lower dies has a stopping surface partially facing the probe accommodating hole and an extended portion inserting hole in alignment with the probe accommodating hole. At least one of the upper and lower non-spring sections has a cylinder portion abutted on the stopping surface and an extended portion inserted through the extended portion inserting hole.

19 Claims, 16 Drawing Sheets

(56) References Cited

U.S. PATENT DOCUMENTS

| | | | | |
|---|---|---|---|---|
| 5,196,789 | A * | 3/1993 | Golden | G01R 1/06722 |
| | | | | 324/72.5 |
| 9,506,949 | B2 * | 11/2016 | Lee | G01R 1/06738 |
| 9,535,092 | B2 * | 1/2017 | Kuo | G01R 1/07307 |
| 9,588,141 | B2 * | 3/2017 | Chen | G01R 1/06705 |
| 2012/0187971 | A1 * | 7/2012 | Huang | G01R 1/06722 |
| | | | | 324/755.05 |
| 2015/0247882 | A1 * | 9/2015 | Lee | G01R 1/06722 |
| | | | | 324/755.05 |
| 2015/0276807 | A1 * | 10/2015 | Chen | G01R 1/06705 |
| | | | | 324/755.05 |
| 2018/0074095 | A1 * | 3/2018 | Hsieh | G01R 1/06722 |
| 2018/0080955 | A1 * | 3/2018 | Hsieh | G01R 1/06722 |

* cited by examiner

SPRING PROBE AND PROBE CARD HAVING SPRING PROBE

BACKGROUND OF THE INVENTION

1. Field of the Invention

The present invention relates generally to spring probes and more particularly, to a sleeve-type spring probe and a probe card having the spring probe.

2. Description of the Related Art

FIG. 1 is an exploded plan view of a conventional spring probe 11 which includes a needle 12, and a spring sleeve 13 sleeved onto the needle 12. FIG. 2 is a schematic sectional view of a probe card 14 using the spring probe 11. For the convenience of illustration, FIG. 2 is not drawn to the same scale with FIG. 1. The probe card 14 includes a circuit board 15 and a probe device 16. The circuit board 15 may be the circuit board adapted for being electrically connected with a tester (not shown). Alternately, the circuit board 15 may be a space transformer disposed between the probe device 16 and the circuit board (not shown) adapted for being electrically connected with a tester (not shown). The probe device 16 includes a probe seat 17 and a plurality of probes 11. For the convenience of illustration, only a small part of the circuit board 15 and the probe seat 17 and one of the probes 11 are shown in FIG. 2.

The needle 12 and the spring sleeve 13 of the spring probe 11 are connected in a way that a connection segment 132, which is provided near the bottom end of the spring sleeve 13, is pressed against the needle 12 and fixed to the needle 12 by welding, such as spot welding. As a result, the connection segment 132 has two convex portions 134 resulted from deformation of the connection segment 132 in the aforesaid press fixing process, and the convex portions 134 protrude over an outer circumferential surface 136 of non-pressed parts of the spring sleeve 13.

The probe seat 17 is composed of upper, middle and lower dies 171, 172, 173; however, the probe seat 17 may be provided without such middle die 172 but composed of the upper and lower dies 171, 173 only. The dies 171, 172, 173 have a plurality of through holes 171a, 172a, 173a respectively, which jointly compose a plurality of installing holes 174 for the installation of the spring probes 11 (only one of the installing holes 174 is shown in FIG. 2). In order that the spring probe 11 can be installed into the installing hole 174 through a top surface 175 of the completely assembled probe seat 17 and rotatable unlimitedly in the installing hole 174 when probing a device under test (hereinafter referred to as the "DUT"), the installing hole 174 is configured as a circular hole with a radius greater than the maximum distance between each convex portion 134 and the center of the spring probe 11.

After the probe device 16 is assembled completely, the circuit board 15 is disposed on the top surface 175 of the probe seat 17. The top end of the spring sleeve 13 is electrically connected with a contact pad of the circuit board 15. The bottom end of the needle 12 is adapted to probe a contact pad of the DUT. Specifically speaking, the top end of the spring sleeve 13 is abutted against the circuit board 15, and the spring sleeve 13 is provided with two spring sections 138 which are compressible elastically. Besides, the connection segment 132 of the spring sleeve 13 is fixed to the bottom section of the needle 12, and a clearance 18 is provided between the top end of the needle 12 and the circuit board 15, i.e. between the top end of the needle 12 and the top end of the spring sleeve 13. Therefore, when the bottom end of the needle 12 contacts the contact pad of the DUT and correspondingly feeds forward, the needle 12 will retract backwards, such that the spring sleeve 13 will be compressed. In this way, the probe 11 can positively contact and electrically connect the contact pad of the DUT; besides, by means of the cushioning effect provided by the spring sleeve 13, an exceeding contact force, which may cause damage or heavy wear of the contact pad of the DUT or the needle, can be prevented.

The outer radius of the aforesaid spring probe 11 is very small, which is usually in a range of several tens micrometers to a little more than one hundred micrometers, and the aspect ratio of the spring probe 11, i.e. a ratio of height to width thereof, is very large, which is usually in a range of 10:1 to 100:1. Besides, except for the convex portions 134 which are relatively closer to the inner wall of the installing hole 174, the other parts of the spring sleeve 13 are quite distanced from the inner wall of the installing hole 174. Therefore, the spring probe 11 is liable to deflect and bend when the bottom end of the needle 12 receives external force, as shown in FIG. 3. This phenomenon may result in problems of inaccurate alignment, unstable probing pressure, and the tendency of fracture of the probe. If the probe is fractured, more problems will arise, such as difficulties in maintaining and replacing the probe. Further, because the installing hole 174 has a large radius, which makes the adjacent probes quite distanced from each other, the fine pitch requirement of the high-density probe card can hardly be fulfilled. Furthermore, when the circuit board 15 is not yet disposed on the top surface 175 of the probe seat 17, and the probe seat 17 is posed upside down, the spring probe 11 will fall from the probe seat 17, causing inconvenience to the assembly of the probe card.

When the test signal is transmitted from the DUT to the circuit board 15 through the spring probe 11, the current of the test signal may be transmitted from the bottom end of the needle 12 to the top end of the needle 12 and then transmitted to the circuit board 15 through the topmost non-spring section 139A. Alternately, the current of the test signal may be transmitted from the bottom end of the needle 12 to the connection segment 132 of the lowest non-spring section 139B, then transmitted from the non-spring section 139B to the non-spring section 139A through the spring sections 138, and finally transmitted to the circuit board 15. In other words, the spring probe 11 has two signal-transmitting paths, which may produce unexpected variation and bring the spring probe 11 unstable in performance. Besides, in the grinding process for grinding the pinpoints of the spring probes 11 to make the pinpoints of all probes 11 be located on a same imaginary plane, the spring probes 11 will spin and thereby affect the grinding force, which will make the spring probes 11 grinded in the same grinding process have unequal lengths. Furthermore, for a good heat-dissipation effect in fixing the spring sleeve 13 to the needle 12 by welding, the non-spring section 139B should be provided with sufficient length. On the other hand, for the non-directionality in sleeving the spring sleeve 13 onto the needle 12, the non-spring section 139A should be provided with equal length to the non-spring section 139B. Such requirements not only limit the flexibility in designing the spring probe 11, but also make the spring probe 11 be configured having quite lengthy; i.e. the spring probe 11 is unable to be configured shorter.

SUMMARY OF THE INVENTION

The present invention has been accomplished in view of the above-noted circumstances. It is an objective of the present invention to provide a spring probe and a probe card having the spring probe, wherein the spring probe can be installed in a relatively smaller hole, thereby prevented from excessive deflection and bend, and the probe card can satisfy the fine pitch requirement; besides, the spring probe is stable in performance and flexible in structural design.

To attain the above objective, the present invention provides a spring probe which is adapted to be disposed in a probe seat. The spring probe includes a spring sleeve having an upper non-spring section, a lower non-spring section, and at least one spring section located between the upper non-spring section and the lower non-spring section. At least one of the upper non-spring section and the lower non-spring section has a stopping structure having a cylinder portion and an extended portion. The extended portion is monolithically connected with a part of an extension end of the cylinder portion in a way that the extension end of the cylinder portion has a stopping part adapted for being abutted on the probe seat.

To attain the above objective, the present invention provides a probe card which includes a probe seat, a spring probe, and a circuit board. The probe seat has a plurality of dies piled on one another and a probe accommodating hole passing through at least one of the dies. The dies include an upper die and a lower die. At least one of the upper die and the lower die has a stopping surface and an extended portion inserting hole located on the stopping surface. A part of the stopping surface faces the probe accommodating hole. At least a part of the extended portion inserting hole is in alignment with the probe accommodating hole. The spring probe is inserted through the probe accommodating hole of the probe seat and includes a spring sleeve having an upper non-spring section, a lower non-spring section, and at least one spring section located between the upper non-spring section and the lower non-spring section. At least one of the upper non-spring section and the lower non-spring section comprises a stopping structure which has a cylinder portion and an extended portion inserted through the extended portion inserting hole. The extended portion is monolithically connected with a part of an extension end of the cylinder portion in a way that the extension end of the cylinder portion has a stopping part that is abutted on the stopping surface of the probe seat. The circuit board is disposed on a top surface of the upper die of the probe seat, and a top end of the spring probe is abutted against a contact pad of the circuit board.

As a result, the spring sleeve is needless to be pressed and welded with another element, so it has no such convex portion as that the spring sleeve of the conventional spring probe has. Therefore, the radius of the probe accommodating hole can be configured just a little larger than the outer radius of the spring sleeve, so that the spring sleeve can be supported by the inner wall of the probe accommodating hole and less possibly deflected and bent. Besides, the inner wall of the probe accommodating hole can be configured very close to the spring sleeve, so the probe card can satisfy the fine pitch requirement. Furthermore, the spring probe has only one signal-transmitting path because the current of the test signal is transmitted by the spring sleeve solely. Therefore, the spring probe is stable in performance. In addition, the spring sleeve has no heat-dissipation problem relating to the welding process, so the lengths of the upper and lower non-spring sections can be shortened without being limited by the heat-dissipation problem. Therefore, the spring probe of the present invention is flexible in structural design.

Preferably, the probe card is assembled in a way that after the extended portion of the spring probe is inserted through the extended portion inserting hole, the upper die or the lower die is moved to make the stopping surface face the probe accommodating hole and make the extended portion inserting hole be partially in alignment with the probe accommodating hole. In this way, the spring probe can be easily installed into the probe seat. However, the extended portion inserting hole may be completely aligned with the probe accommodating hole.

Preferably, the upper non-spring section may have the stopping structure, i.e. have the cylinder portion and the extended portion. The extended portion of the upper non-spring section is adapted to be abutted against a contact pad of a circuit board that is adapted to be disposed on the probe seat. In this way, after the spring probe is disposed in the probe seat, the spring probe will not fall from the probe seat even when the probe seat is posed upside down. More preferably, the stopping structure of the upper non-spring section or the lower non-spring section may be formed by removing a part of a complete cylinder in a way that the cylinder portion and the extended portion are configured in a stepwise manner and the extended portion is offset from a central axis of the spring probe. Besides, the maximum width of the extended portion may be smaller than the diameter of the outer circumferential surface of the cylinder portion, so that the cylinder portion can be stopped on the upper die or the lower die stably and the wasted material can be reduced. Furthermore, the extended portion may have an arc-shaped end or a pointed end. However, the upper non-spring section of the spring sleeve is not limited to have the aforesaid extended portion. The upper non-spring section may have a cylinder portion, the top end of which is adapted to be abutted against a contact pad of a circuit board disposed on the probe seat.

The spring probe of the present invention may further include a needle, and the spring sleeve is sleeved onto the needle and partially fixed to the needle, thereby enhancing the overall structural strength of the spring probe. Although the way of fixing the spring sleeve to the needle may cause a convex portion on the spring sleeve, the structural design of the spring sleeve of the present invention enables the probe seat to be easily and conveniently configured with a space for accommodating the convex portion, thereby preventing the convex portion from being set in the probe accommodating hole. In this way, the radius of the probe accommodating hole can be configured just a little larger than the outer radius of the spring sleeve that has not yet provided with the convex portion.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention, and wherein.

DETAILED DESCRIPTION OF THE INVENTION

Figure 1:
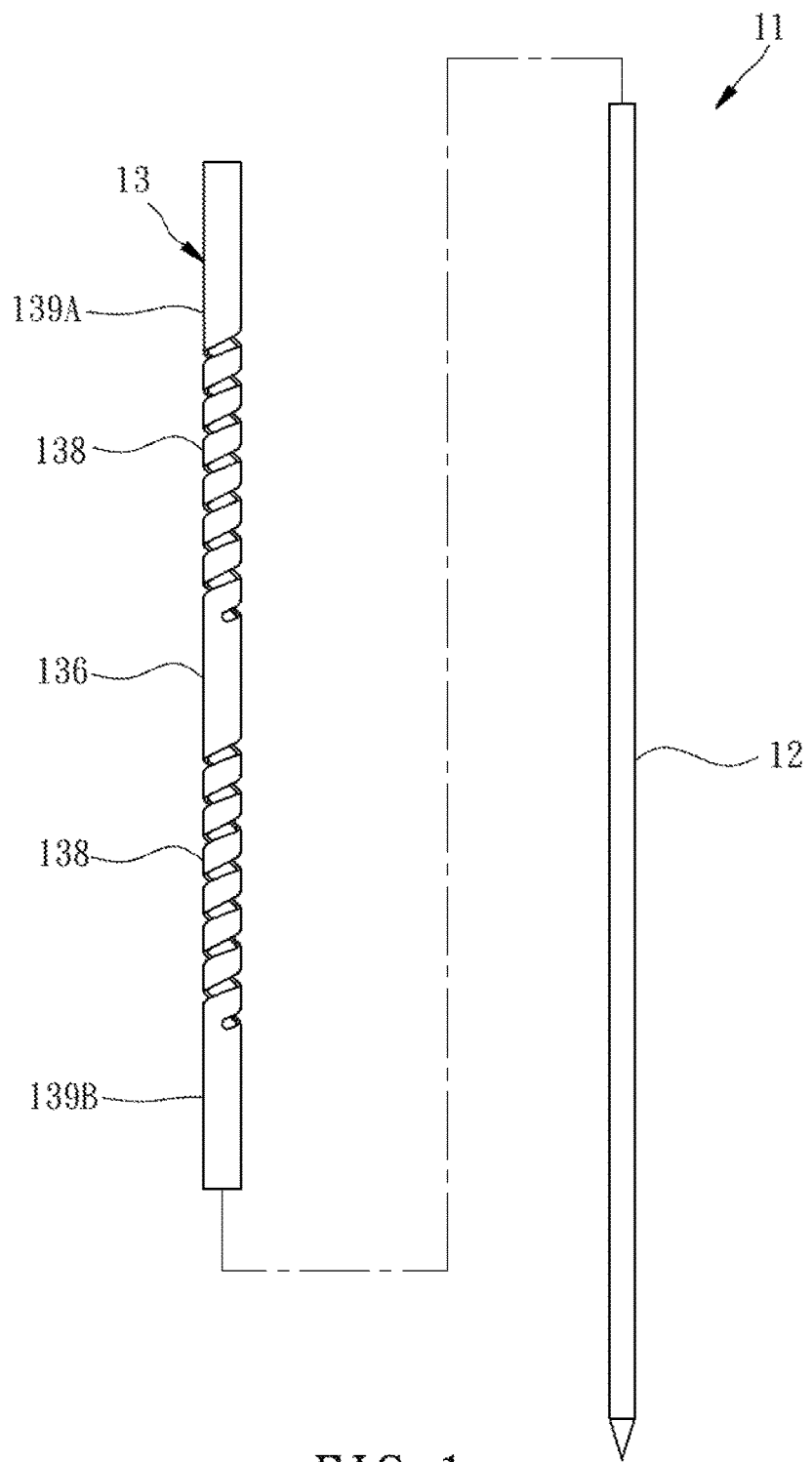
FIG. 1 is an exploded plan view of a conventional spring probe.
Figure 2:
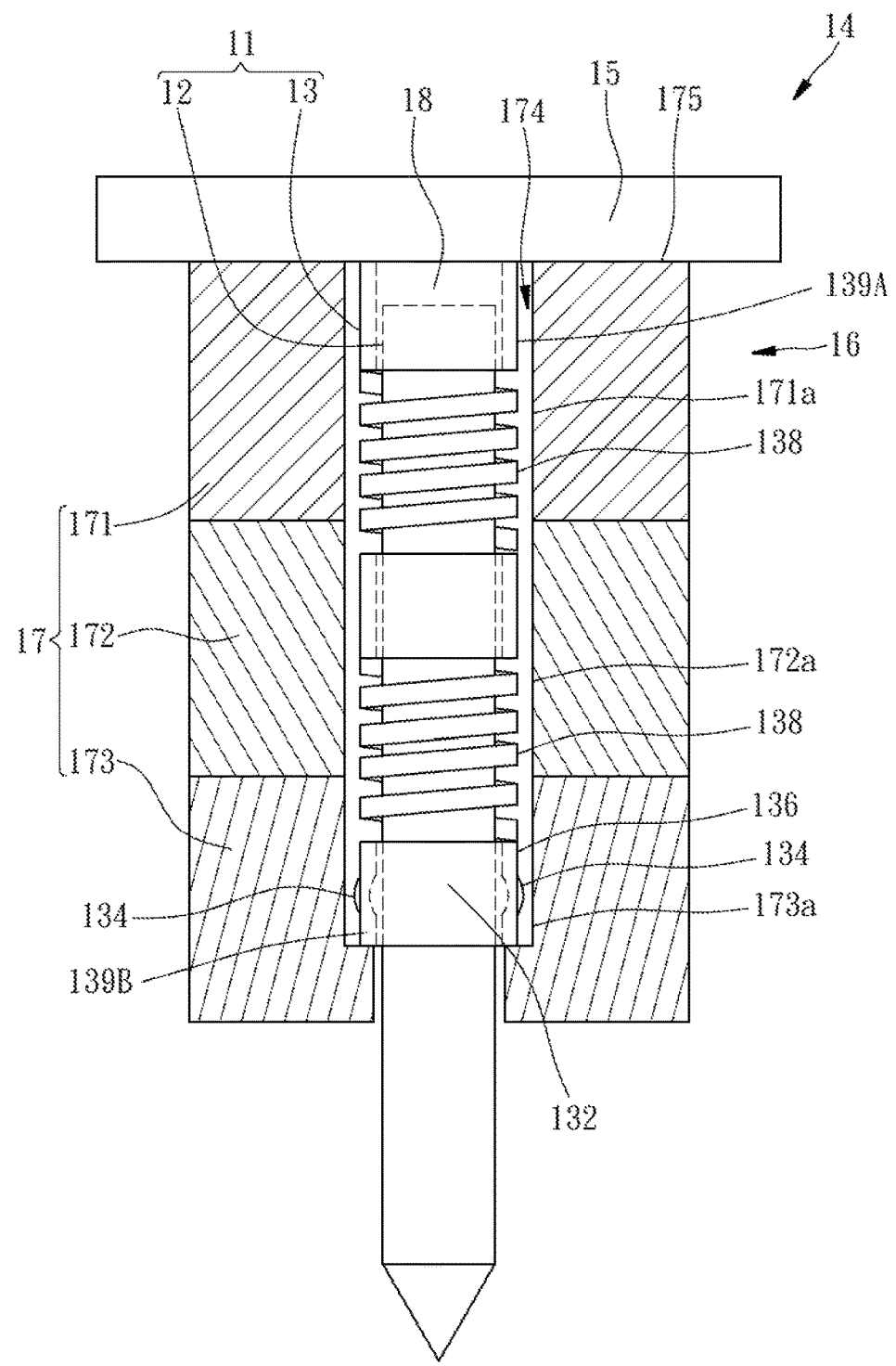
FIG. 2 is a schematic sectional view of a conventional probe card using the conventional spring probe.
Figure 3:
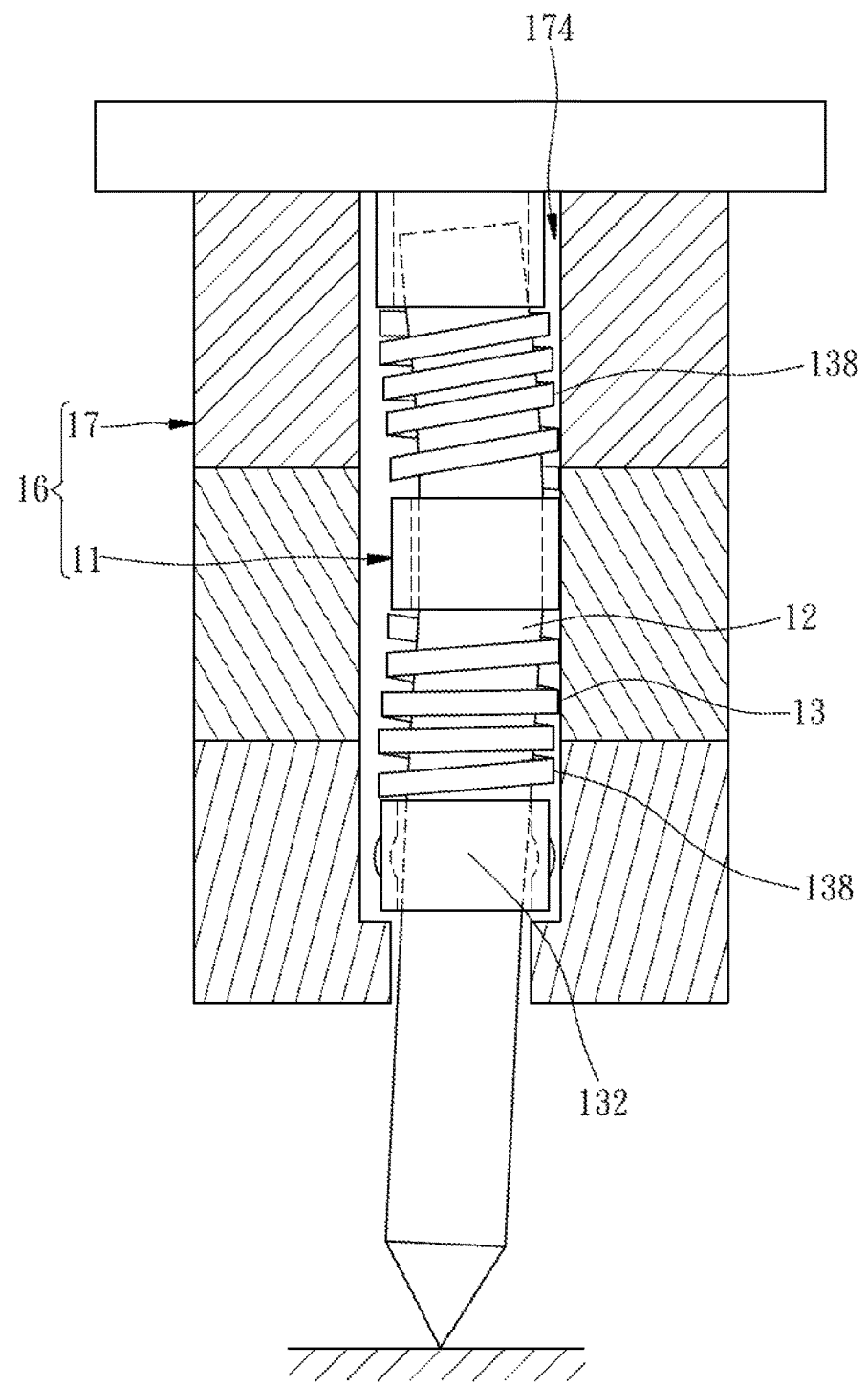
FIG. 3 is similar to FIG. 2, but showing the spring probe deflects and bends when receiving an external force.

First of all, it is to be mentioned that same reference numerals used in the following preferred embodiments and the appendix drawings designate same or similar elements throughout the specification for the purpose of concise illustration of the present invention.

Figure 4:
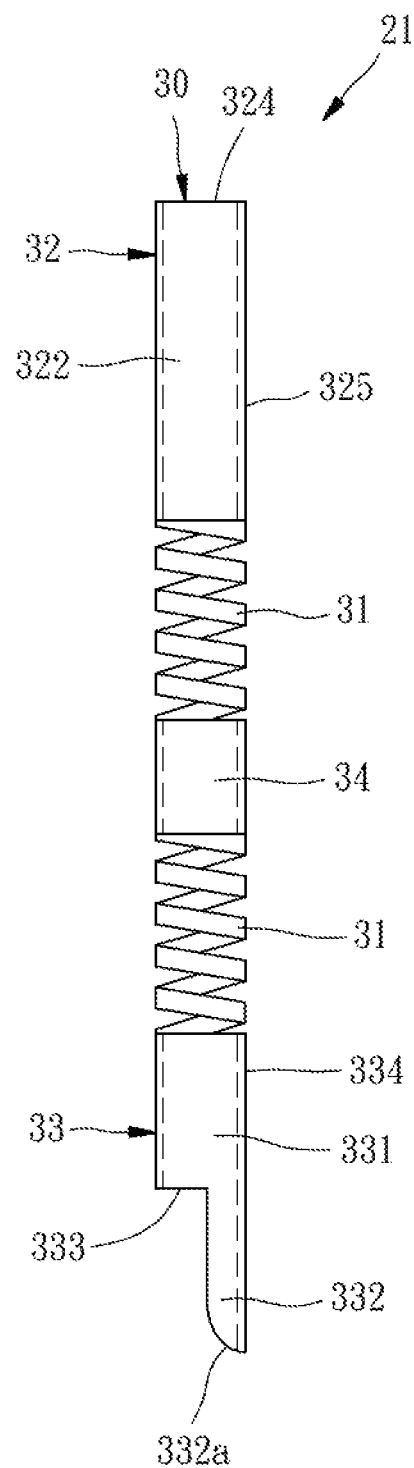
FIG. 4 is a schematic view of a spring probe according to a first preferred embodiment of the present invention.
Figure 5:
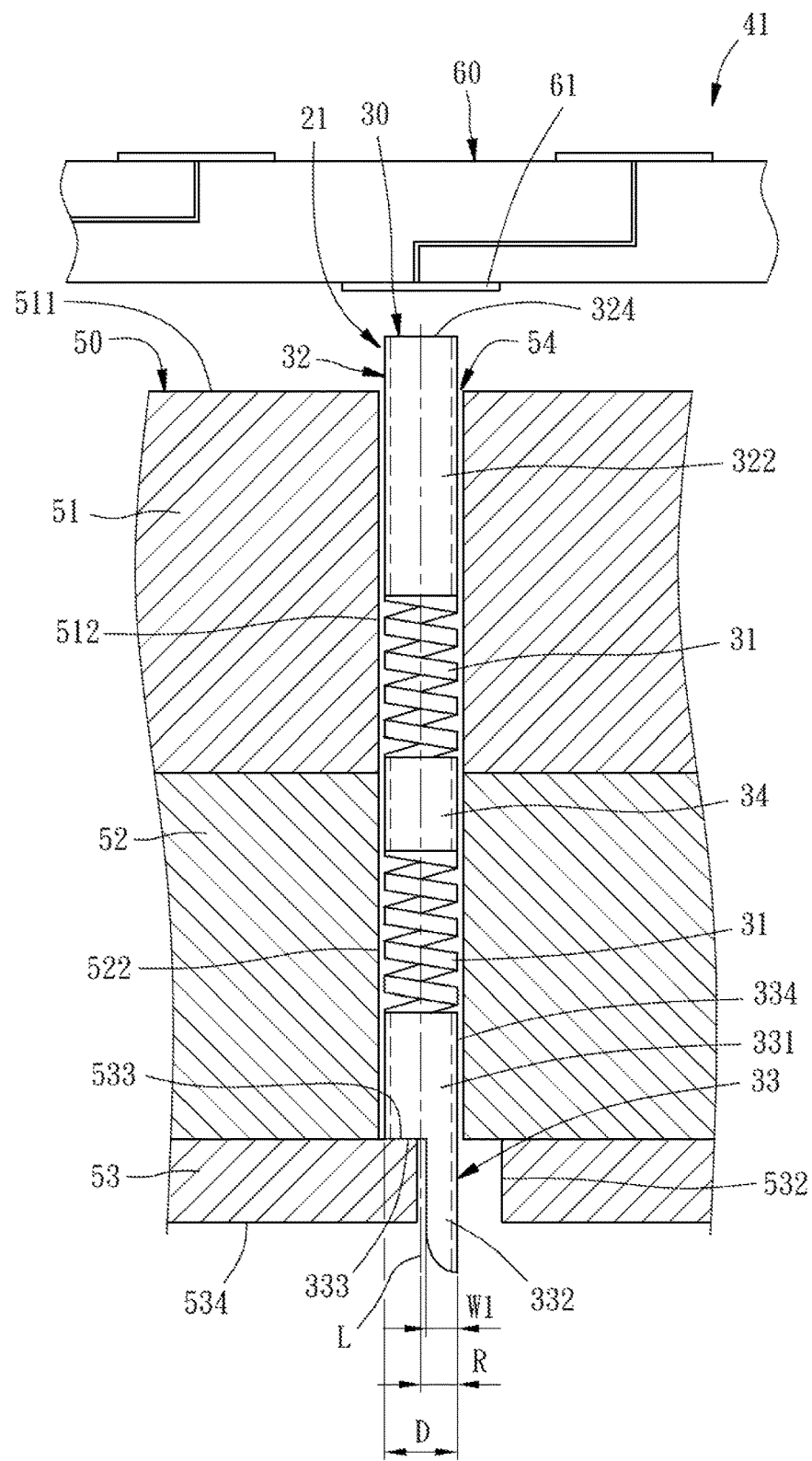
FIG. 5 is a schematic sectional view of a probe card having the spring probe according to the first preferred embodiment of the present invention, showing the status that a circuit board is not yet disposed on a top surface of a probe seat.

Referring to FIG. 4, a spring probe 21 according to a first preferred embodiment of the present invention includes a spring sleeve 30. A circular metal pipe with uniform diameter is processed by photolithography technique to form at least one spring section 31 helically opened through an outer circumferential surface thereof, thereby becoming the spring sleeve 30. The at least one spring section 31 is located between an upper non-spring section 32 and a lower non-spring section 33. Besides, the lower non-spring section 33 is formed from an originally complete cylinder as the upper non-spring section 32. A part of the originally complete cylinder is removed by a process such as etching, so that the cylinder becomes the lower non-spring section 33 formed with a stopping structure having a cylinder portion 331 and an extended portion 332. For the convenience of illustration, the cylinder portion 331 and the extended portion 332 of the lower non-spring section 33 are hereinafter referred to as the lower cylinder portion 331 and the pinpoint portion 332, respectively. The pinpoint portion 332 is monolithically connected with a part of an extension end of the lower cylinder portion 331, i.e. the bottom end of the lower cylinder portion 331, in such a way that the lower cylinder portion 331 and the pinpoint portion 332 are combinedly configured in a stepwise manner that the pinpoint portion 332 is offset from a central axis L of the probe 21, as shown in FIG. 5. In this embodiment, the aforesaid removed part of the cylinder is larger than the pinpoint portion 332. That is to say, when it is viewed from a terminal end 332a of the pinpoint portion 332 toward the upper non-spring section 32, the pinpoint portion 332 is shaped as an arc smaller than a semicircle. However, in the present invention the pinpoint portion 332 is not limited to the aforesaid size, and may be shaped as a semicircle or an arc larger than a semicircle.

In this embodiment, the spring sleeve 30 has two spring sections 31. Therefore, the non-spring sections of the spring sleeve 30 include not only the upper and lower non-spring sections 32, 33, but also a middle non-spring section 34 located between the two spring sections 31. It is to be understood that the spring sleeve 30 may have no such middle non-spring section 34 if it has only one spring section 31, and the spring sleeve 30 may have more than one middle non-spring section 34 if it has more than two spring sections 31.

Referring to FIG. 5, the spring probe 21 is adapted to be used in a probe card 41. The probe card 41 includes a probe seat 50, a circuit board 60, and a spring probe 21. The amount of the spring probe 21 of the probe card 41 is unlimited. In practice, the probe card in each of this embodiment and the following embodiments may include many spring probes. For the convenience of illustration, only a small part of the probe seat 50 and the circuit board 60 and one of the spring probes are shown in the drawings of this embodiment and the following embodiments.

The probe seat 50 has a plurality of dies piled on one another. In this embodiment, the dies include an upper die 51, a middle die 52, and a lower die 53. The spring probe 21 is installed in the probe seat 50, and then the probe seat 50 is fixed to the circuit board 60 in a way that a top surface 511 of the upper die 51 faces the circuit board 60.

Specifically speaking, the upper, middle and lower dies 51, 52, 53 have upper, middle and lower through holes 512, 522, 532, respectively. The upper through hole 512 and the middle through hole 522 are equal in diameter and completely aimed with respect to each other in a line. The lower through hole 532 is equal in diameter to the upper and middle through holes 512, 522, but being not completely aligned in position to the upper and middle through holes 512, 522, i.e. the lower through hole 532 is partially offset from a central axis of the upper and middle through holes 512, 522. In this way, the upper through hole 512 and the middle through hole 522 combinedly form a probe accommodating hole 54. The lower die 53 has a stopping surface 533 and a part of the stopping surface 533 of the lower die 53 faces the probe accommodating hole 54. For the convenience of illustration, the stopping surface 533 of the lower die 53 is referred to as the lower stopping surface 533 hereinafter. A part of the lower through hole 532 is in alignment with the probe accommodating hole 54. The spring probe 21 is inserted through the probe accommodating hole 54. Because the pinpoint portion 332 of the lower non-spring section 33 is monolithically connected with a part of the bottom end (i.e. extension end) of the lower cylinder portion 331, the other part of the bottom end of the lower cylinder portion 331, i.e. the part denoted by the reference numeral 333 in FIG. 4 and defining with the pinpoint portion 332 a stepwise portion, is configured as a stopping part 333 for being abutted on the lower stopping surface 533 to position the probe 21 in the probe seat 50 and prevent the probe 21 from falling from the probe seat 50. The pinpoint portion 332 is inserted through the lower through hole 532 and protruded out from a bottom surface 534 of the lower die 53 for probing a DUT (not shown). In other words, the lower through hole 532 in this embodiment is configured as an extended portion inserting hole which is defined in the present invention as the hole provided on the stopping surface for stopping the probe and adapted for being inserted with the extended portion of the probe therethrough. When the circuit board 60 is not yet fixed on the top surface 511 of the upper die 51, the upper non-spring section 32 of the probe 21 is partially protruded out from the top surface 511 of the upper die 51. When the circuit board 60 is fixed on the top surface 511, the spring sections 31 of the probe 21 are a little compressed so that the upper non-spring section 32 is completely received in the probe accommodating hole 54 and the top end of the upper non-spring section 32 is abutted against a contact pad 61 of the circuit board 60. The circuit board 60 may be the circuit board that is adapted for being electrically connected with a tester (not shown), or may be a space transformer disposed between the probe seat 50 and another circuit board (not shown) for being electrically connected with a tester (not shown).

Figure 8:
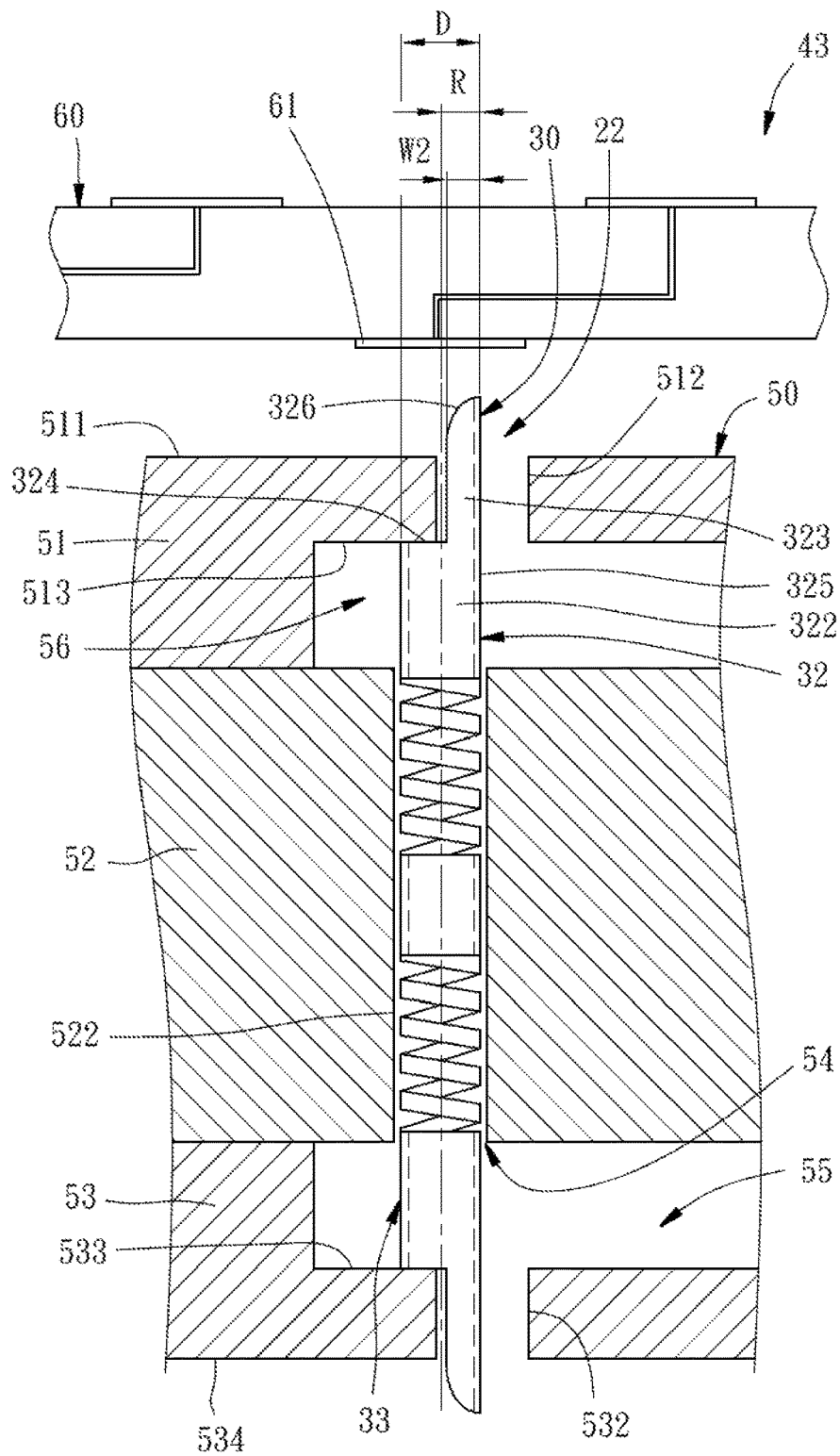
Figure 9:
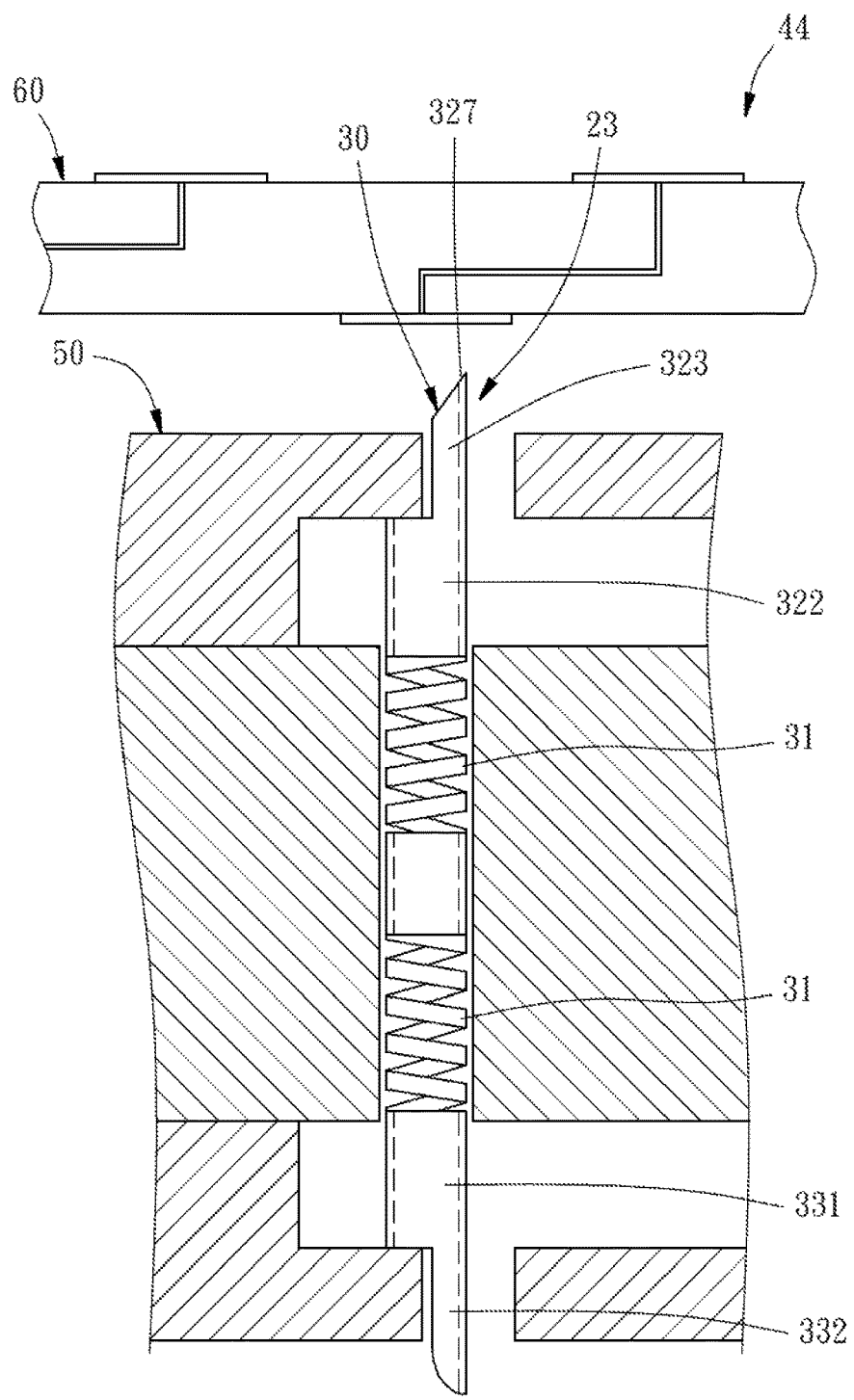

The terminal end 332a of the pinpoint portion 332 may be an arc-shaped end as the arc-shaped end 326 shown in FIG. 8, or a pointed end as the pointed end 327 shown in FIG. 9. In this way, when the DUT is contacted with the terminal end 332a of the pinpoint portion 332, the contact resistance between the DUT and the terminal end 332a is relatively lower, thereby enhancing testing stability. Besides, in order to increase the structural strength of the pinpoint portion 332, the thickness of the pinpoint portion 332 may be increased, or a metal layer may be formed on the arced inner wall of the pinpoint portion 332 by a process such as electroplating or chemical plating, or a solid metal layer may be fixedly attached on the arced inner wall of the pinpoint portion 332 by welding.

In this way, the spring sleeve 30 is needless to be pressed and welded with another element, thereby retaining uniform outer radius and having no such convex portion as that the spring sleeve of the conventional spring probe has. Therefore, the radius of the probe accommodating hole 54 of the probe seat 50 can be configured just a little larger than the outer radius of the spring sleeve 30, allowing the probe 21 to be inserted through the probe accommodating hole 54. As a result, the probe 21 can be supported by the inner wall of the probe accommodating hole 54, thereby less possibly deflected and bent. Besides, the inner radius of the probe accommodating hole 54 is small, enabling the probe card 41 to satisfy the fine pitch requirement. In addition, because the spring probe 21 transmits the current of the test signal by the spring sleeve 30 solely, the spring probe 21 has only one signal-transmitting path, which is stable in performance. Furthermore, the probe 21 has no heat-dissipation problem relating to the welding process, such that the lengths of the upper and lower non-spring sections 32, 33 of the spring sleeve 30 can be shortened without being limited by the heat-dissipation problem. Therefore, the spring probe 21 is relatively more flexible in structural design.

Figure 6:
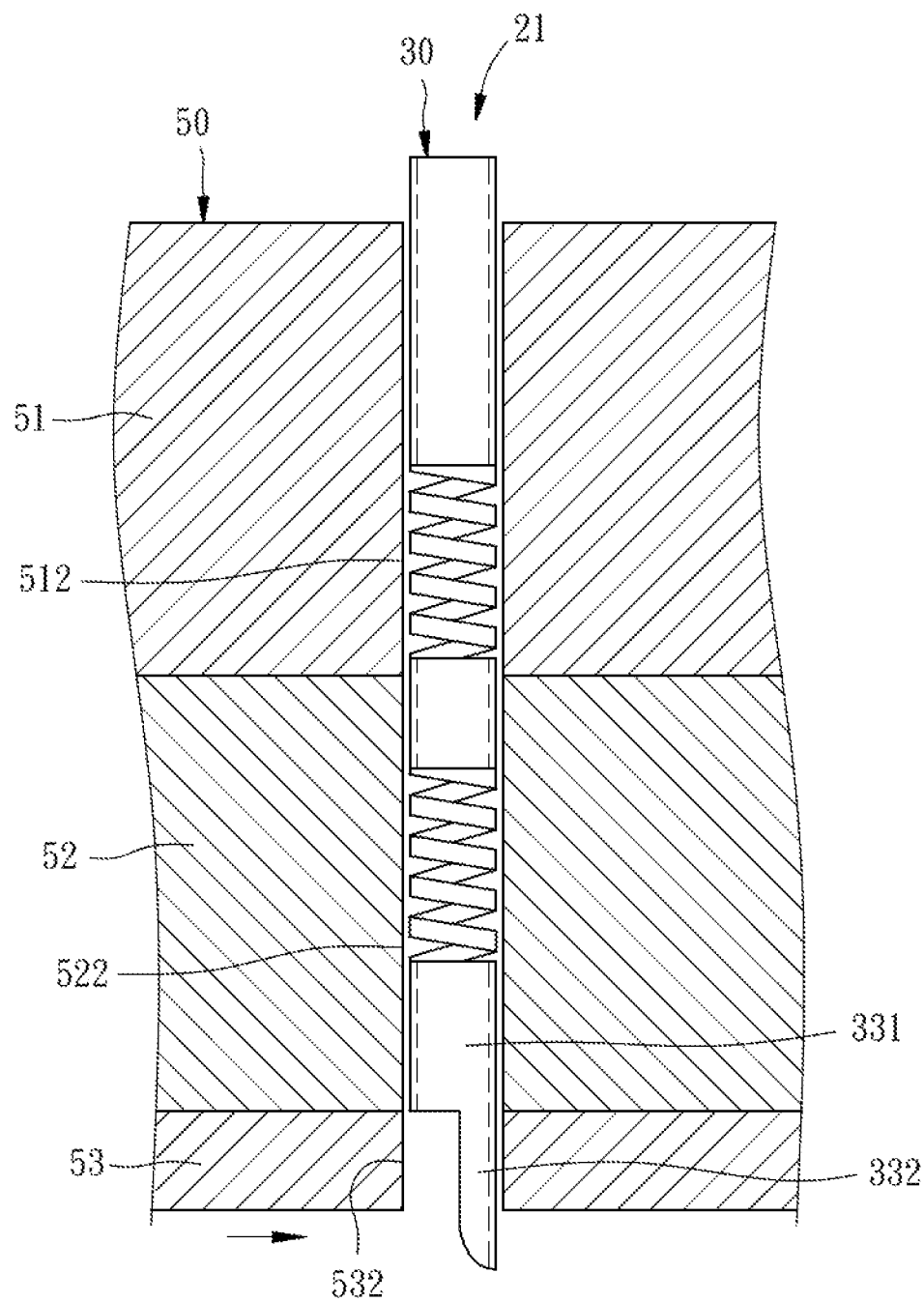
FIG. 6 is similar to FIG. 5, but showing the status that the spring probe is not yet stopped by a lower die, and the circuit board is not shown for purpose of concise illustration.
Figure 7:
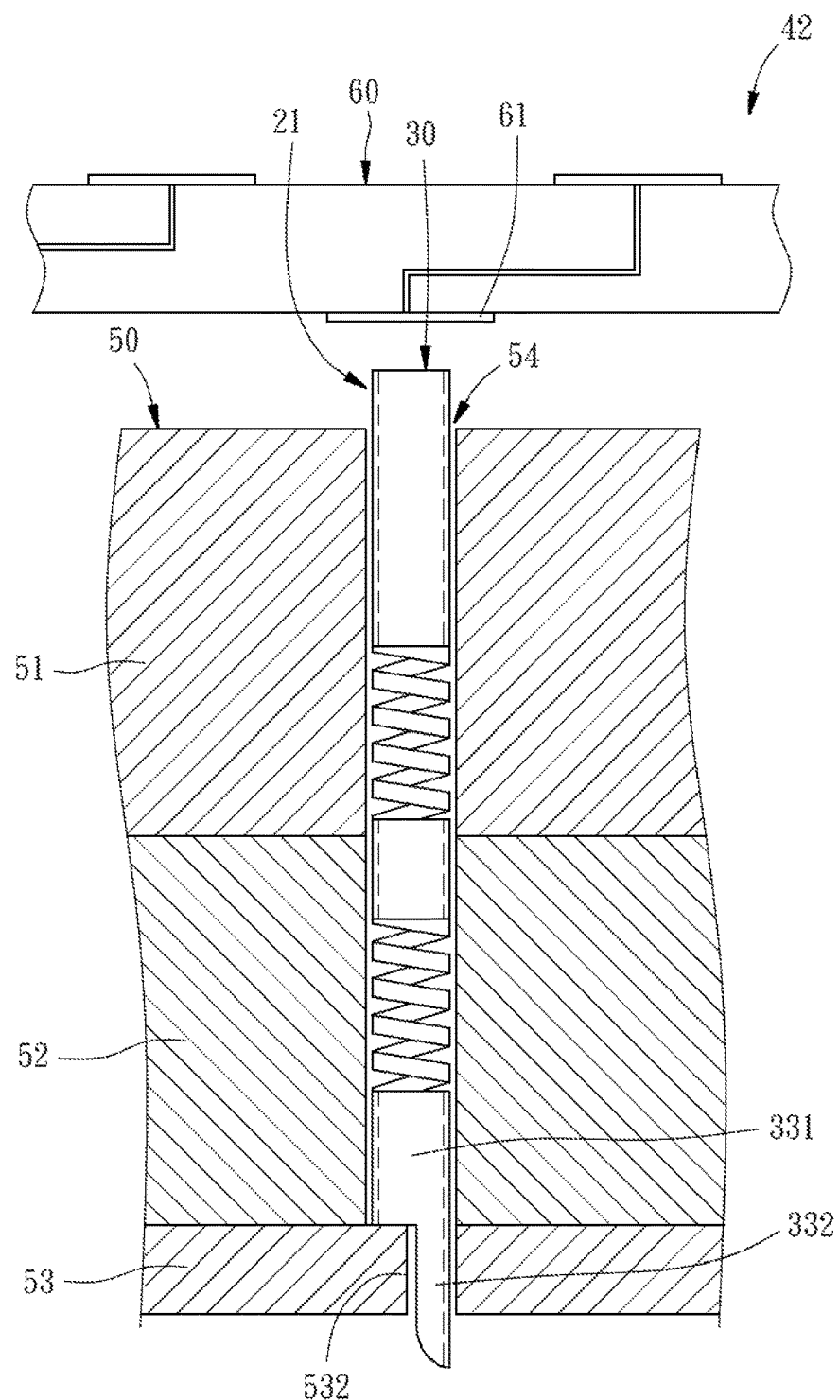
FIGS. 7-10, 11A, 11B, and 12-15 are schematic sectional views of a probe card having a spring probe according to second to tenth preferred embodiments of the present invention, showing the status that a circuit board is not yet disposed on a top surface of a probe seat.

In the assembling process of the aforesaid probe card 41, the lower die 53 of the probe seat 50 can be firstly disposed at the position as shown in FIG. 6 to make the lower through hole 532 be completely aligned in position to the upper and middle through holes 512, 522. After the pinpoint portion 332 of the spring probe 21 is inserted through the lower through hole 532, the lower die 53 is moved rightward to the position as shown in FIG. 5 to make the lower stopping surface 533 face the probe accommodating hole 54 and make the lower through hole 532 be partially aligned in position to the probe accommodating hole 54, and then the lower die 53 is fixed to the upper and middle dies 51, 52. The aforesaid structural design and assembling process of the lower die 53 facilitate insertion of the pinpoint portion 332 through the lower through hole 532. However, the lower die 53 may be configured as that depicted in the probe card 42 according to a second preferred embodiment of the present invention as shown in FIG. 7, wherein the lower through hole 532 is sized to just allow the pinpoint portion 332 to be inserted therethrough and completely aligned in position to the probe accommodating hole 54.

In the spring probe of the present invention, the maximum width W1 of the pinpoint portion 332 is smaller than the radius R of an outer circumferential surface 334 of the lower cylinder portion 331, as shown in FIG. 5. In this way, the bottom end of the lower cylinder portion 331 has relatively larger part for being abutted on the lower stopping surface 533, which means the stopping part 333 is relatively larger. This design enables the spring probe 21 to be disposed in the probe seat 50 stably. Besides, the removed part of the original lower non-spring section 33, which is removed to make the originally complete cylindrical lower non-spring section 33 be formed with the pinpoint portion 332, can be formed into the pinpoint portion 332 or tail portion 323 (as shown in FIG. 8 and specified in the next paragraph) of another spring probe, so that the wasted material can be reduced. However, the maximum width W1 of the pinpoint portion 332 is not limited to be smaller than the radius R of the outer circumferential surface 334. The aforesaid effect of reducing the wasted material can be achieved as long as the maximum width W1 is smaller than the diameter D of the outer circumferential surface 334.

In the aforesaid spring probe 21, the upper non-spring section 32 of the spring sleeve 30 only has a cylinder portion 322 shaped as a complete cylinder, and a top end 324 of the cylinder portion 322 is adapted to be abutted against the contact pad 61 of the circuit board 60. However, the upper non-spring section 32 may be configured having a stopping structure as the upper non-spring section 32 of the spring probe 22 of the probe card 43 according to a third preferred embodiment of the present invention as shown in FIG. 8. In this third preferred embodiment, the upper non-spring section 32 is shaped as the lower non-spring section 33, which may be formed by removing a part of a complete cylinder so as to enable the upper non-spring section 32 to have a stopping structure including a cylinder portion 322 and an extended portion 323. For the convenience of illustration, the cylinder portion 322 and the extended portion 323 of the stopping structure of the upper non-spring section 32 are hereinafter referred to as the upper cylinder portion 322 and the tail portion 323, respectively. The tail portion 323 is monolithically connected with a part of an extension end of the upper cylinder portion 322, i.e. the top end 324 of the upper cylinder portion 322, such that the other part of the top end 324 of the upper cylinder portion 322 is configured as a stopping part for being abutted on a stopping surface 513 of the upper die 51 before the circuit board 60 is fixed on the top surface 511. For the convenience of illustration, the stopping surface 513 of the upper die 51 is referred to as the upper stopping surface 513 hereinafter.

In other words, in the case that the upper non-spring section 32 has the tail portion 323, the upper die 51 may have an upper stopping surface 513 partially facing the probe accommodating hole 54. Besides, the upper through hole 512 penetrates through the upper stopping surface 513 and the top surface 511 and partially aligned in position to the probe accommodating hole 54, so that the tail portion 323 can be inserted through the upper through hole 512 and abutted against the contact pad 61 of the circuit board 60. In other words, the upper through hole 512 in this embodiment is also an extended portion inserting hole according to the aforesaid definition in the present invention. As a result, after the spring probe 22 is disposed in the probe seat 50, the probe 22 will not fall from the probe seat 50 even if the probe seat 50 is posed upside down. Similarly, the maximum width W2 of the tail portion 323 may be smaller than the radius R of an outer circumferential surface 325 of the upper cylinder portion 322, so that the upper non-spring section 32 can be abutted on the upper die 51 stably and the wasted material can be reduced. However, the maximum width W2 of the tail portion 323 is not limited to be smaller than the radius R of the outer circumferential surface 325. The aforesaid effect of reducing the wasted material can be achieved as long as the maximum width W2 is smaller than the diameter D of the outer circumferential surface 325.

As shown in FIG. 8, the lower stopping surface 533 is not limited to be contacted with the middle die 52, but may be separated from the middle die 52 by a space 55. Similarly, the upper stopping surface 513 may be separated from the middle die 52 by another space 56, or may be contacted with the middle die 52, depending on the usage requirement. Besides, the tail portion 323 can be shaped according to the usage requirement. As shown in FIG. 8, the tail portion 323 may have an arc-shaped end 326. Alternately, the tail portion 323 may be configured as that of the spring probe 23 of the probe card 44 according to a fourth preferred embodiment of the present invention as shown in FIG. 9, which has a pointed end 327. When the aforesaid arc-shaped end 326 or pointed end 327 is contacted with the contact pad 61, the contact resistance therebetween is relatively lower, thereby enhancing testing stability. Because the upper non-spring section 32 having the upper cylinder portion 322 and the tail portion 323 is configured in a stepwise manner in this embodiment, the chips produced from the contact between the upper non-spring section 32 and the contact pad 61 can be discharged through the hollow void between the upper cylinder portion 322 and the tail portion 323. In other words, the specific design of the upper non-spring section 32 can provide a chip discharging effect to assist discharge of the chips produced from the contact of the upper non-spring section 32 with the contact pad 61, thereby preventing the defective contact problem resulted from the accumulation of the chips. The tail portion 323 is monolithically connected with a part of the upper cylinder portion 322, so that the top end 324 of the upper cylinder portion 322 has a stopping part. The top end 324 of the upper cylinder portion 322 is abutted on the upper stopping surface 513 of the upper die 51 of the probe seat 50, and the tail portion 323 is inserted through the upper through hole 512. It will be appreciated that the spring sleeve 30 may be formed from a circular metal pipe with uniform diameter by processing, so the spring sleeve 30 may be substantially configured as a circular pipe with uniform diameter. Besides, in some embodiments of the present invention, the spring probe can be provided with the stopping structure only at the upper non-spring section 32, but not at the lower non-spring section 33. That is to say, the upper non-spring section 32 has the tail portion 323 and the stopping part provided at the top end of the upper cylinder portion 322 but the lower cylinder portion 331 has no such stopping part 333 and may have the traditional pinpoint as shown in FIG. 11B.

Figure 10:
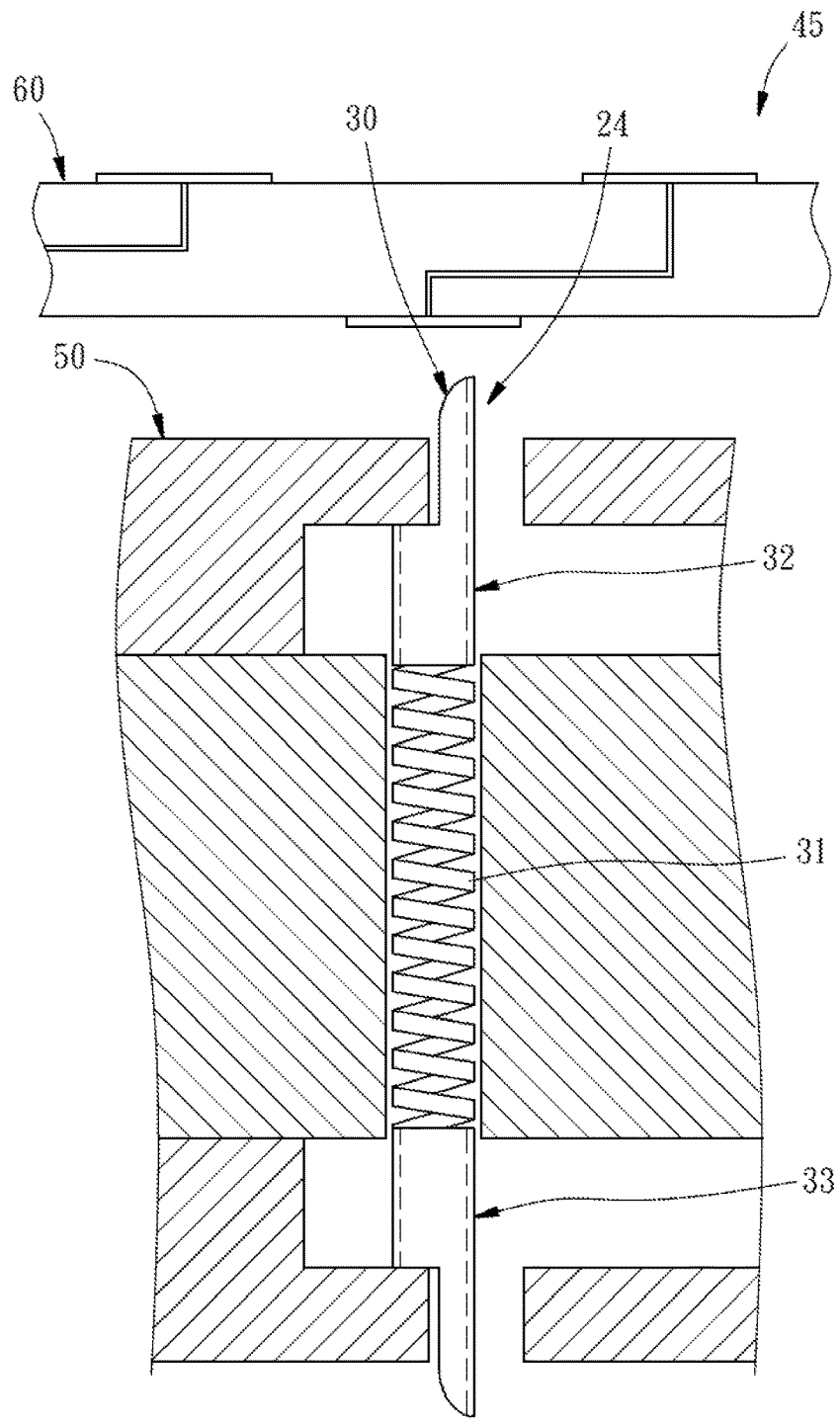

As shown in FIG. 9, the two spring sections 31 of the spring sleeve 30 may be helically extended in two reverse helical directions respectively. Alternately, the amount of the spring sections 31 of the spring sleeve 30 may be an even number more than two, and every two of the spring sections 31 are helically extended in two reverse helical directions respectively. In this way, when the pinpoint portion 332 or the tail portion 323 of the spring sleeve 30 receives a force, the torques of the spring sections 31 will be counteracted by each other. The aforesaid feature can prevent the probe from spin when the probe probes the DUT, so as to prevent the stability of the probe in transmitting signal from being affected by spin of the probe. The aforesaid feature can also prevent the probe from spin in the grinding process, so as to prevent the grinding force from being affected by spin of the probe. However, the spring sleeve 30 is not limited to have the aforesaid feature, but may have a plurality of spring sections 31 helically extended in the same helical direction, such as the spring sleeve 30 of the aforesaid probes 21, 22. Alternately, the spring sleeve 30 may have only one spring section 31, such as the spring sleeve 30 of the spring probe 24 of the probe card 45 according to a fifth preferred embodiment of the present invention as shown in FIG. 10.

As shown in FIGS. 11-15, the spring probe of the present invention may further include a needle 70. The spring sleeve 30 is sleeved onto the needle 70 and partially fixed to the needle 70, so that the structural strength of the spring probe is increased by the needle 70. Although in such probe as provided in the following embodiments the way of fixing the spring sleeve 30 to the needle 70 may cause a convex portion on the spring sleeve 30, the structural design of the spring sleeve 30 of the present invention enables the probe seat 50 to be easily and conveniently configured with the space 55 or 56 for accommodating the convex portion, thereby preventing the convex portion from being set in the probe accommodating hole 54. In this way, the inner radius of the probe accommodating hole 54 can be configured just a little larger than the outer radius of the spring sleeve 30 that has not yet provided with the convex portion.

Figure 11A:
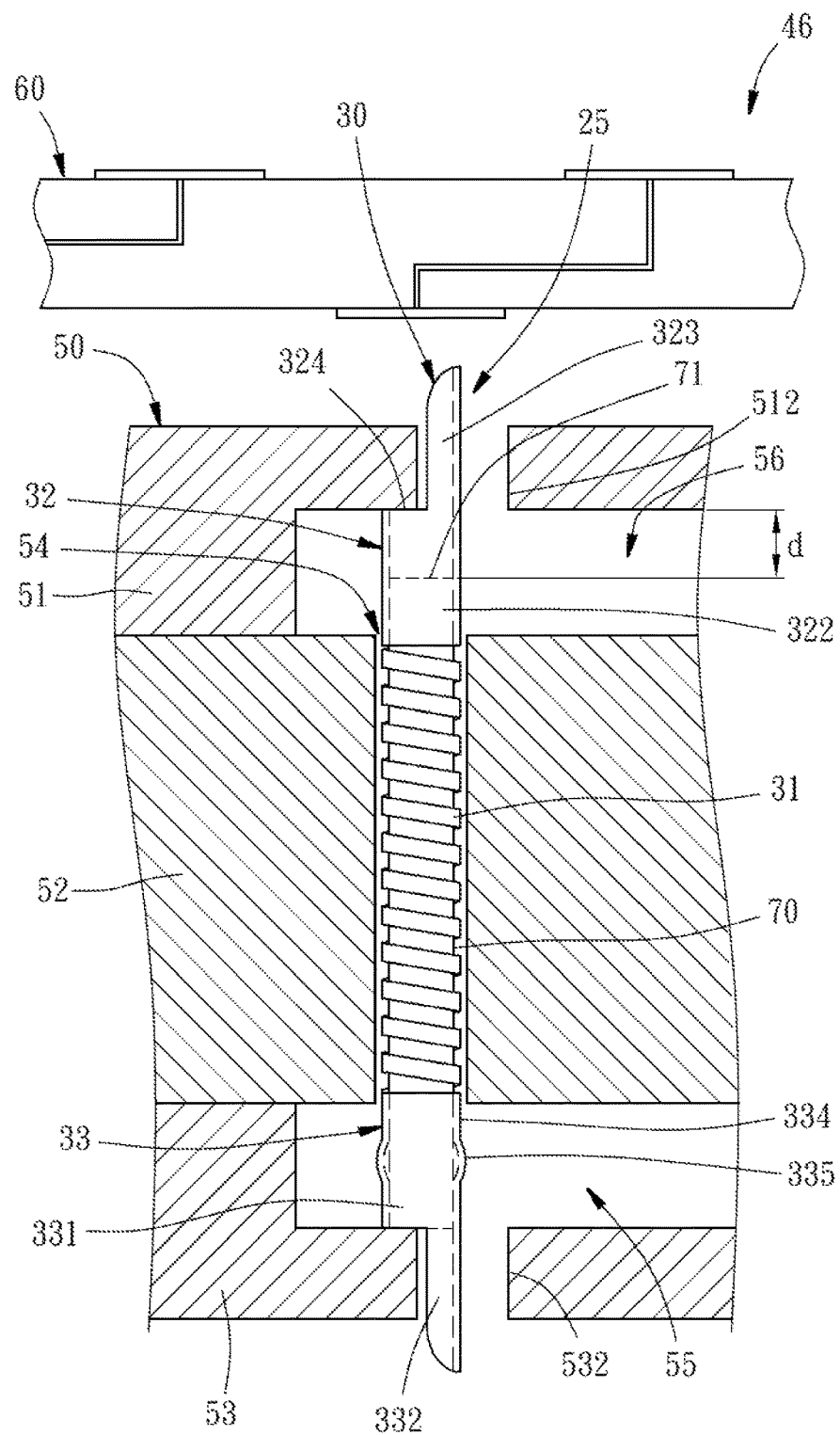
Figure 11B:
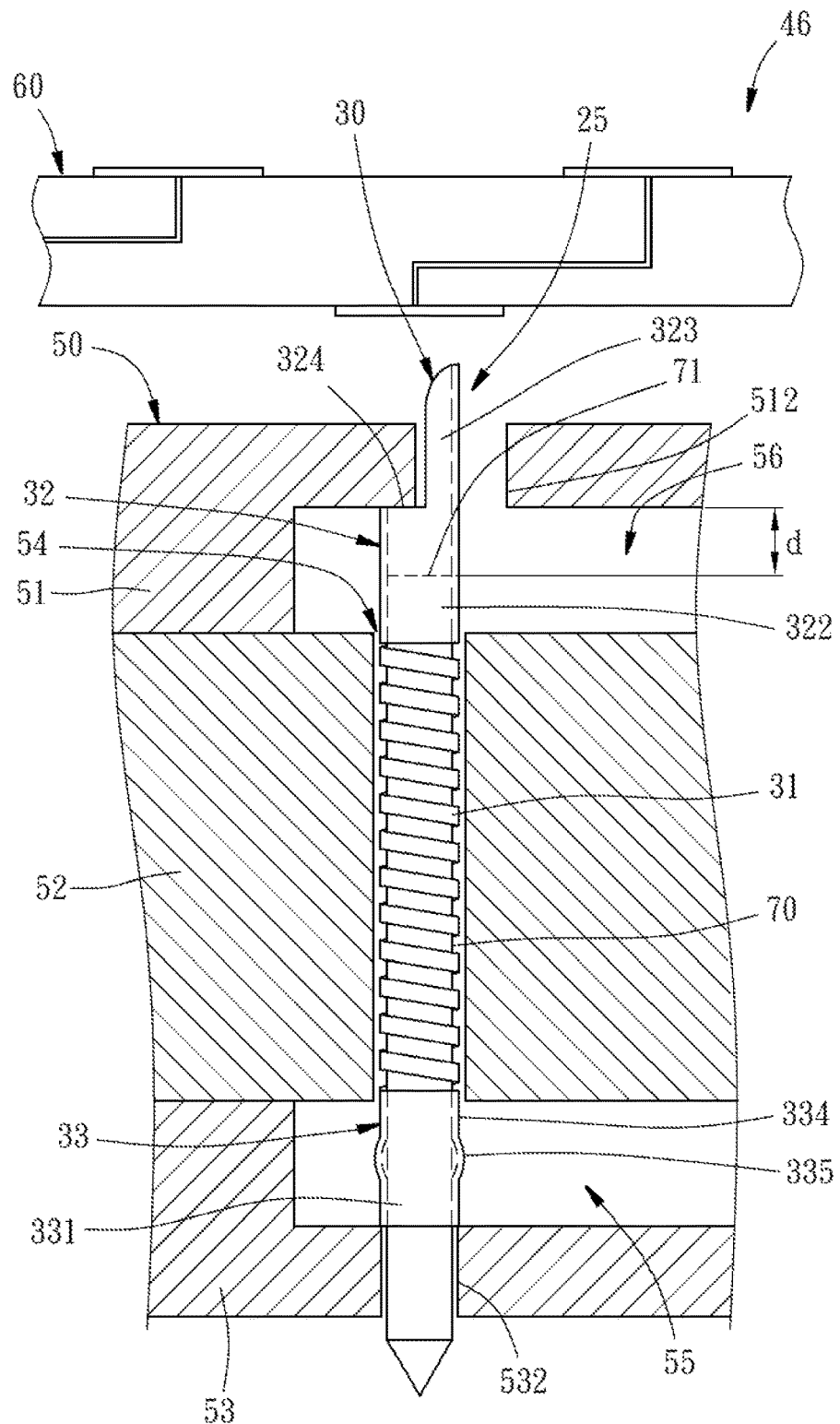

In the spring probe 25 of the probe card 46 according to a sixth preferred embodiment of the present invention as shown in FIG. 11A, the lower cylinder portion 331 of the lower non-spring section 33 of the spring sleeve 30 is pressed against the needle 70 and fixed to the needle 70 by welding. The lower non-spring section 33 has two convex portions 335 (unlimited in amount) located at opposite positions, which are resulted from the aforesaid press fixing process. The convex portions 335 are protruded over the outer circumferential surface 334 of the lower cylinder portion 331. A top end 71 of the needle 70 is located in the upper cylinder portion 322 in such a way that a distance d exists between the top end 71 of the needle 70 and the top end 324 of the upper cylinder portion 322, allowing the needle 70 to move upwards along with the lower non-spring section 33. In such case, the space 55 located between the probe accommodating hole 54 and the lower through hole 532 of the probe seat 50 is necessary for accommodating the convex portions 335; however, the space 56 located between the probe accommodating hole 54 and the upper through hole 512 can be optionally provided, and the upper non-spring section 32 is not limited to have the tail portion 323. Alternately, as shown in FIG. 11B, the lower non-spring section 33 may not have the aforesaid pinpoint portion 332, i.e. have no such stopping structure, and the needle 70 is inserted through the lower through hole 532 for probing the DUT.

Figure 12:
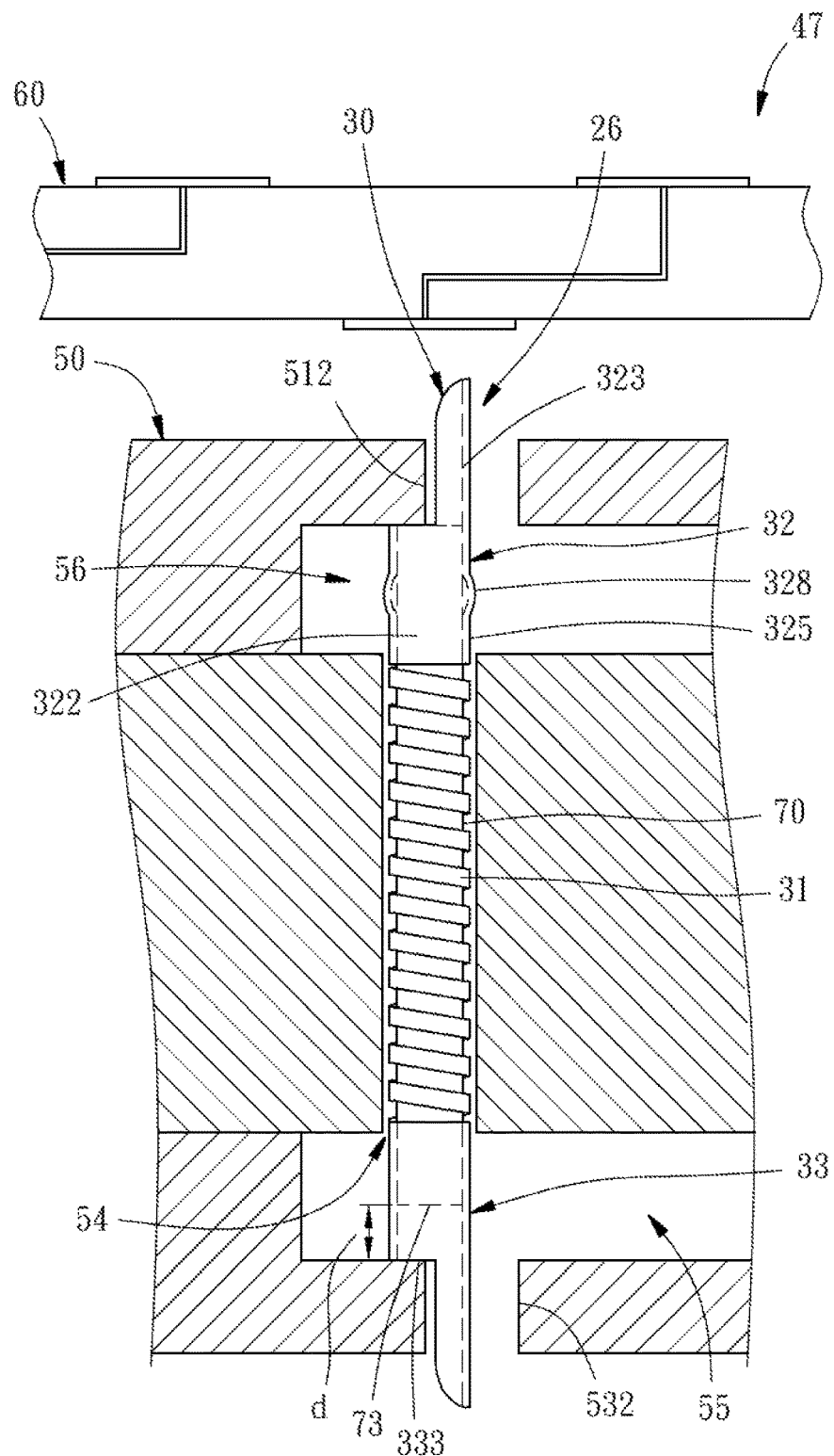

In the spring probe 26 of the probe card 47 according to a seventh preferred embodiment of the present invention as shown in FIG. 12, the upper cylinder portion 322 of the upper non-spring section 32 of the spring sleeve 30 is pressed against the needle 70 and fixed to the needle 70 by welding. The upper non-spring section 32 has two convex portions 328 (unlimited in amount) located at opposite positions, which are resulted from the aforesaid press fixing process. The convex portions 328 are protruded over the outer circumferential surface 325 of the upper cylinder portion 322. A bottom end 73 of the needle 70 is located in the lower cylinder portion 33 in such a way that a distance d exists between the bottom end 73 of the needle 70 and the stopping part 333 of the lower cylinder portion 33. In such case, the space 56 located between the probe accommodating hole 54 and the upper through hole 512 of the probe seat 50 is necessary for accommodating the convex portions 328; however, the space 55 located between the probe accommodating hole 54 and the lower through hole 532 can be optionally provided, and the upper non-spring section 32 is not limited to have the tail portion 323.

Figure 13:
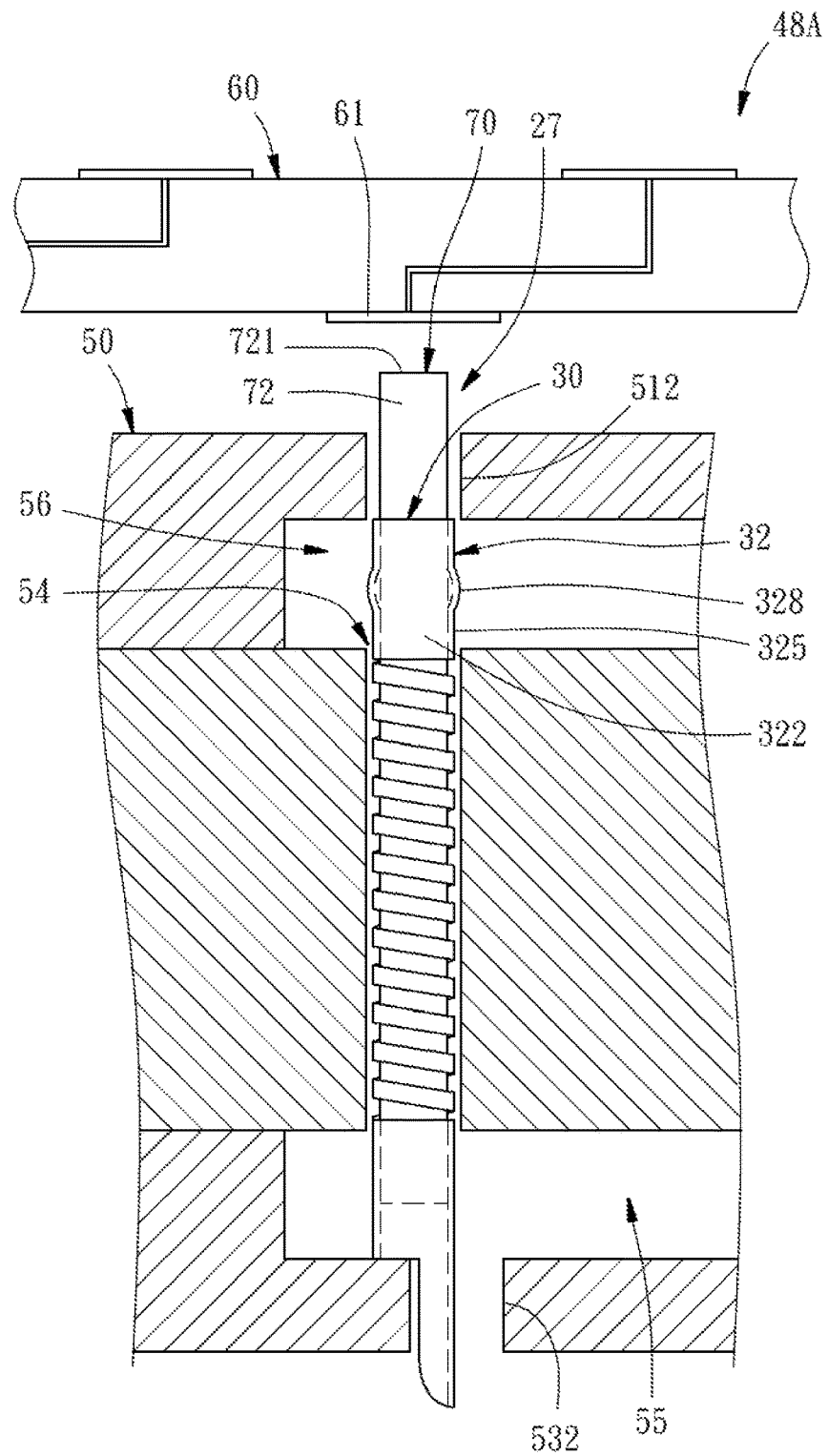
Figure 14:
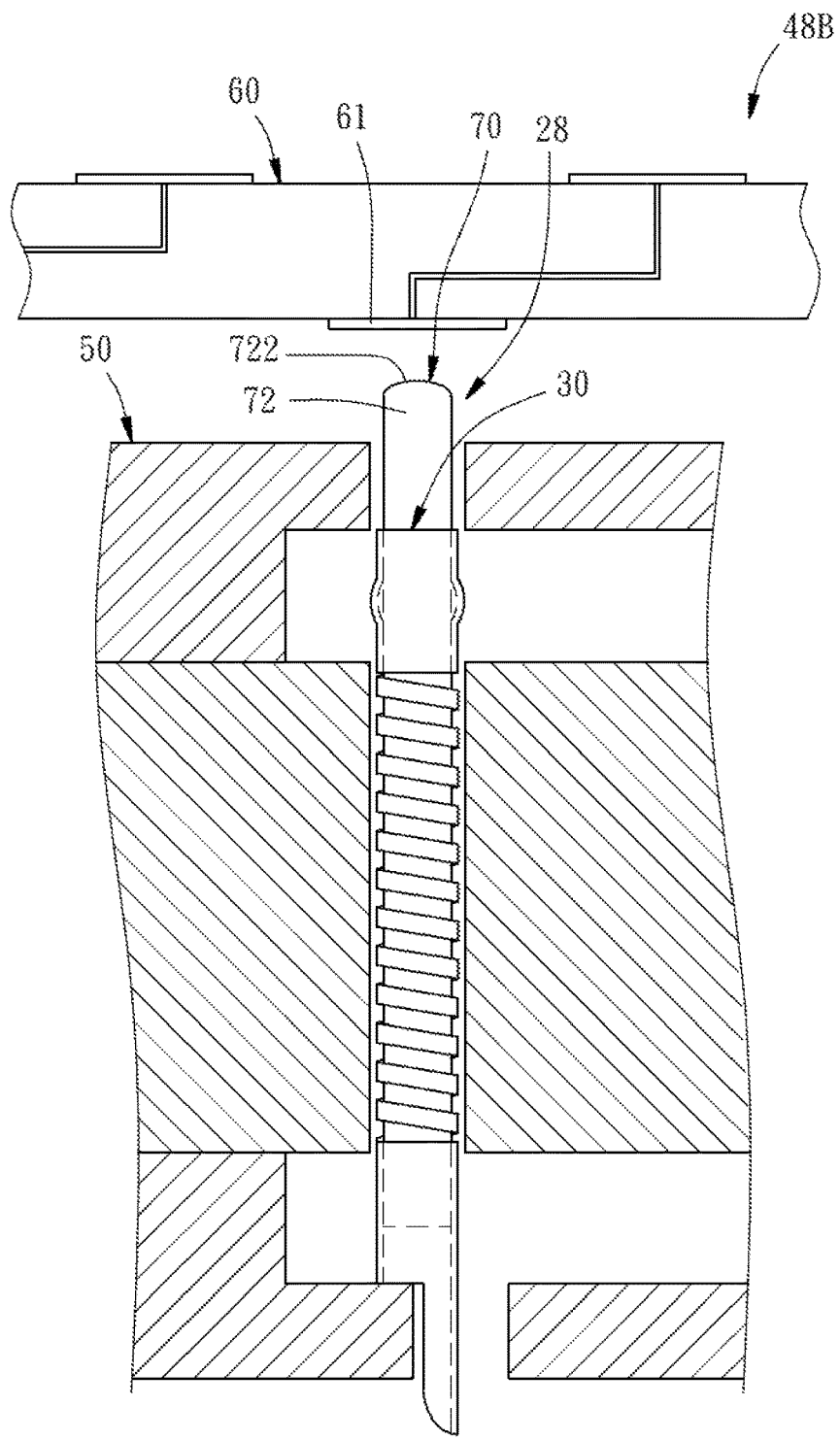
Figure 15:
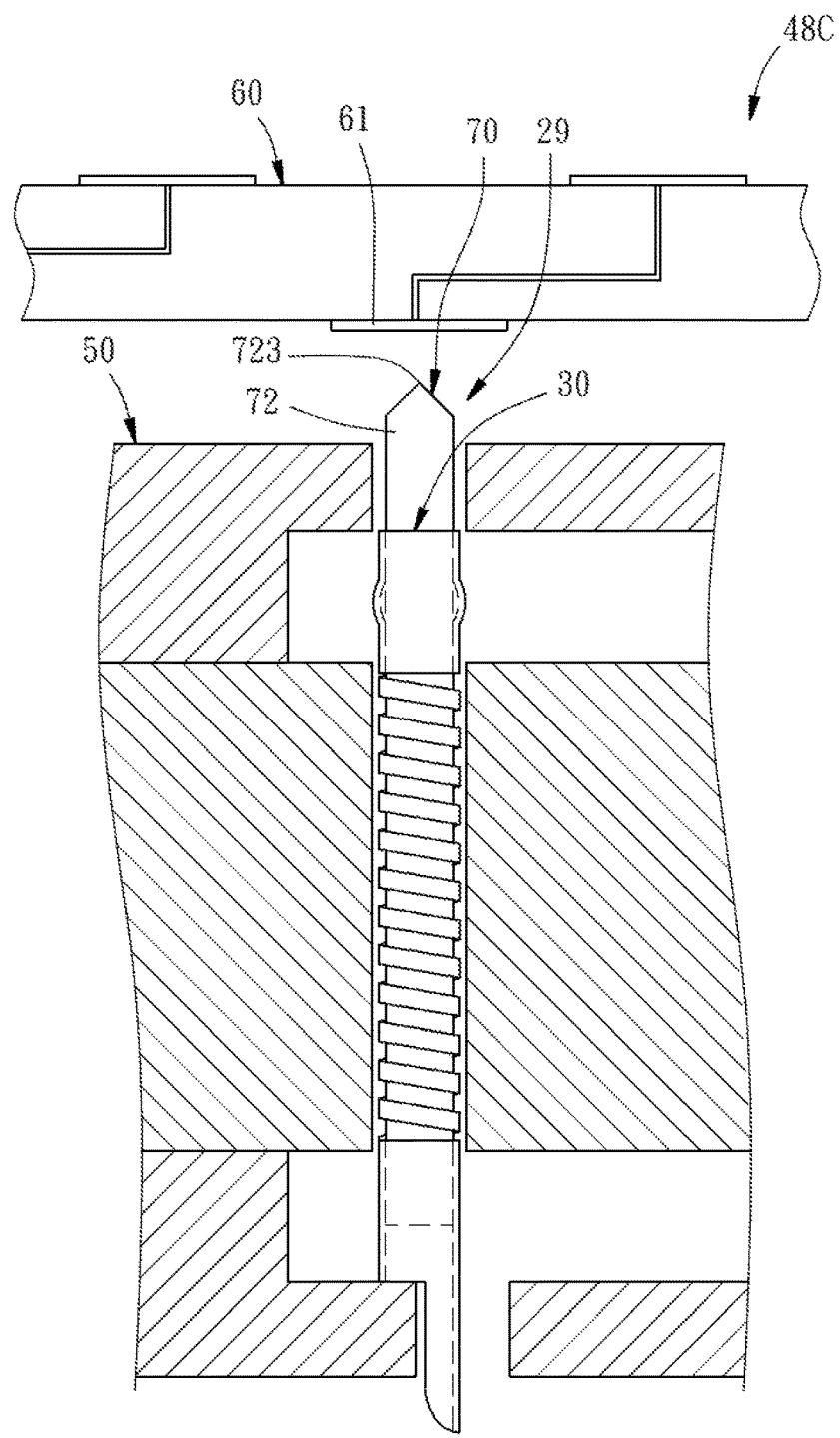

In the case that the upper non-spring section 32 is fixed to the needle 70 and has the convex portion 328 but no tail portion 323, such as the spring probes 27, 28, 29 of the probe cards 48A, 48B, 48C according to the eighth to tenth preferred embodiments of the present invention as shown in FIGS. 13-15, the needle 70 may have a tail section 72 protruded out of the upper non-spring section 32. In such case, the space 56 located between the probe accommodating hole 54 and the upper through hole 512 of the probe seat 50 is necessary for accommodating the convex portion 328; however, the space 55 located between the probe accommodating hole 54 and the lower through hole 532 can be optionally provided; the tail section 72 is inserted through the upper through hole 512 and abutted against the contact pad 61 of the circuit board 60. The tail section 72 can be shaped according to the usage requirement. For example, the tail section 72 may have a flat end 721 as shown in FIG. 13, an arc end 722 as shown in FIG. 14, or a pointed end 723 as shown in FIG. 15.

It will be appreciated that the spring probe of the present invention is not limited to be configured having a lower non-spring section provided with a lower cylinder portion and a pinpoint portion. The spring probe may be configured in a way that the lower non-spring section has the stopping structure including the lower cylinder portion and the pinpoint portion and/or the upper non-spring section has the stopping structure including the upper cylinder portion and the tail portion. That is, the spring probe may be configured in a way that at least one of the upper and lower non-spring sections has a stopping structure providing a stopping part formed at the bottom end, i.e. extension end, of the lower cylinder portion or at the top end, i.e. extension end, of the upper cylinder portion.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A spring probe, which is adapted to be disposed in a probe seat, comprising:
   a spring sleeve having an upper non-spring section, a lower non-spring section, and at least one spring section located between the upper non-spring section and the lower non-spring section;
   wherein each of the upper non-spring section and the lower non-spring section comprises a stopping structure having a cylinder portion provided with an extension end, and an extended portion; the extended portion is monolithically connected with a part of the extension end of the cylinder portion in a way that the extension end of the cylinder portion has a stopping part adapted for being abutted on the probe seat.

2. The spring probe as claimed in claim 1, wherein a maximum width of the extended portion of each of the stopping structures is smaller than a diameter of an outer circumferential surface of the cylinder portion of each of the stopping structures.

3. The spring probe as claimed in claim 1, wherein each of the stopping structures is formed by removing a part of a complete cylinder in a way that the cylinder portion and the extended portion are configured in a stepwise manner and the extended portion is offset from a central axis of the spring probe.

4. The spring probe as claimed in claim 1, further comprising a needle; wherein the spring sleeve is sleeved onto the needle and partially fixed to the needle.

5. The spring probe as claimed in claim 1, wherein the extended portion of the stopping structure of the upper non-spring section is adapted to be abutted against a contact pad of a circuit board that is adapted to be disposed on the probe seat.

6. The spring probe as claimed in claim 5, further comprising a needle; wherein the spring sleeve is sleeved onto the needle, and the lower non-spring section is fixed to the needle and has an outer circumferential surface and a convex portion protruded over the outer circumferential surface; a top end of the needle is located in the cylinder portion of the stopping structure of the upper non-spring section in a way that a distance exists between the top end of the needle and the extension end of the cylinder portion of the stopping structure of the upper non-spring section.

7. The spring probe as claimed in claim 5, further comprising a needle; wherein the spring sleeve is sleeved onto the needle, and the cylinder portion of the stopping structure of the upper non-spring section is fixed to the needle; the upper non-spring section has a convex portion protruded over an outer circumferential surface of the cylinder portion.

8. The spring probe as claimed in claim 1, wherein a terminal end of the extended portion of each of the stopping structures is configured as an arc-shaped end.

9. The spring probe as claimed in claim 1, further comprising a needle; wherein the spring sleeve is sleeved onto the needle, and the upper non-spring section is fixed to the needle and has an outer circumferential surface and a convex portion protruded over the outer circumferential surface; the needle has a tail section protruded out of the upper non-spring section for being abutted against a contact pad of a circuit board that is adapted to be disposed on the probe seat.

10. The spring probe as claimed in claim 1, further comprising a needle; wherein the spring sleeve is sleeved onto the needle, and the lower non-spring section comprises the stopping structure; the cylinder portion of the stopping structure of the lower non-spring section is fixed to the needle, and the lower non-spring section has a convex portion protruded over an outer circumferential surface of the cylinder portion; a top end of the needle is located in the upper non-spring section in a way that a distance exists between the top end of the needle and a top end of the upper non-spring section.

11. A probe card comprising:
    a probe seat having a plurality of dies piled on one another and a probe accommodating hole passing through at least one of the dies, the dies comprising an upper die and a lower die, each of the upper die and the lower die having a stopping surface and an extended portion inserting hole located on the stopping surface, a part of each of the stopping surfaces facing the probe accommodating hole, at least a part of each of the extended portion inserting holes being in alignment with the probe accommodating hole;
    a spring probe inserted through the probe accommodating hole of the probe seat and comprising a spring sleeve having an upper non-spring section, a lower non-spring section, and at least one spring section located between the upper non-spring section and the lower non-spring section, each of the upper non-spring section and the lower non-spring section comprising a stopping structure which has a cylinder portion provided with an extension end, and an extended portion inserted through one of the extended portion inserting holes, the extended portion being monolithically connected with a part of the extension end of the cylinder portion in a way that the extension end of the cylinder portion has a stopping part that is abutted on one of the stopping surfaces of the probe seat; and a circuit board disposed on a top surface of the upper die of the probe seat, the spring probe being abutted against a contact pad of the circuit board.

12. The probe card as claimed in claim 11, wherein the probe card is assembled in a way that after the extended portion of the stopping structure of the lower non-spring section of the spring probe is inserted through the extended portion inserting hole of the lower die, the lower die is moved to make the stopping surface of the lower die face the probe accommodating hole and make the extended portion inserting hole of the lower die be partially in alignment with the probe accommodating hole.

13. The probe card as claimed in claim 11, wherein the probe card is assembled in a way that after the extended portion of the stopping structure of the upper non-spring section of the spring probe is inserted through the extended portion inserting hole of the upper die, the upper die is moved to make the stopping surface of the upper die face the probe accommodating hole and make the extended portion inserting hole of the upper die be partially in alignment with the probe accommodating hole.

14. The probe card as claimed in claim 11, wherein the extended portion inserting hole is completely in alignment with the probe accommodating hole.

15. The probe card as claimed in claim 11, wherein the extended portion of the stopping structure of the upper non-spring section of the spring probe is inserted through the extended portion inserting hole of the upper die and abutted against the contact pad of the circuit board.

16. The probe card as claimed in claim 15, wherein the spring probe further comprises a needle, and the spring sleeve is sleeved onto the needle; the lower non-spring section is fixed to the needle and has an outer circumferential surface and a convex portion protruded over the outer circumferential surface; a top end of the needle is located in the cylinder portion of the stopping structure of the upper non-spring section in a way that a distance exists between the top end of the needle and the extension end of the cylinder portion of the stopping structure of the upper non-spring section; the lower die of the probe seat has a lower through hole through which the needle is inserted; the probe seat has a space located between the probe accommodating hole and the lower through hole, and the convex portion is located in the space.

17. The probe card as claimed in claim 15, wherein the spring probe further comprises a needle, and the spring sleeve is sleeved onto the needle; the cylinder portion of the stopping structure of the upper non-spring section is fixed to the needle, and the upper non-spring section has a convex portion protruded over an outer circumferential surface of the cylinder portion; the lower non-spring section also comprises the stopping structure; a distance exists between a bottom end of the needle and the stopping part of the stopping structure of the lower non-spring section; the probe seat has a space located between the probe accommodating hole and the extended portion inserting hole of the upper die, and the convex portion is located in the space.

18. The probe card as claimed in claim 11, wherein the upper die of the probe seat has an upper through hole, and the probe seat has a space located between the upper through hole and the probe accommodating hole; the spring probe further comprises a needle, and the spring sleeve is sleeved onto the needle; the upper non-spring section is fixed to the needle and has an outer circumferential surface and a convex portion protruded over the outer circumferential surface and located in the space; the needle has a tail section which is protruded out of the upper non-spring section, inserted through the upper through hole, and abutted against the contact pad of the circuit board.

19. The probe card as claimed in claim 11, wherein the spring probe further comprises a needle, and the spring sleeve is sleeved onto the needle; the lower non-spring section comprises the stopping structure; the cylinder portion of the stopping structure of the lower non-spring section is fixed to the needle, and the lower non-spring section has a convex portion protruded over an outer circumferential surface of the cylinder portion; a top end of the needle is located in the upper non-spring section in a way that a distance exists between the top end of the needle and a top end of the upper non-spring section; the lower die of the probe seat has the stopping surface and the extended portion inserting hole; the probe seat has a space located between the probe accommodating hole and the extended portion inserting hole of the lower die, and the convex portion is located in the space.

* * * * *